US010257968B2

(12) United States Patent
Huang et al.

(10) Patent No.: US 10,257,968 B2
(45) Date of Patent: Apr. 9, 2019

(54) ASSEMBLING COMPONENT AND ASSEMBLING METHOD THEREOF

(71) Applicant: Wistron Corporation, New Taipei (TW)

(72) Inventors: Tzu-Chieh Huang, New Taipei (TW); Hsu-Lung Lai, New Taipei (TW); Tsung-Ming Lee, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 15/611,794

(22) Filed: Jun. 2, 2017

(65) Prior Publication Data

US 2018/0249598 A1   Aug. 30, 2018

(30) Foreign Application Priority Data

Feb. 24, 2017 (TW) .............................. 106106349 A

(51) Int. Cl.
 *H05K 9/00* (2006.01)
(52) U.S. Cl.
 CPC .......... *H05K 9/006* (2013.01); *H05K 9/0032* (2013.01); *H05K 9/0075* (2013.01); *H05K 9/0067* (2013.01)
(58) Field of Classification Search
 CPC .................................................. H05K 9/0032
 See application file for complete search history.

(56) References Cited

U.S. PATENT DOCUMENTS

| 5,886,879 A * | 3/1999 | Matuschik | H05K 9/006 174/372 |
| 6,140,577 A * | 10/2000 | Rapaich | H05K 9/0016 174/354 |
| 6,274,808 B1 * | 8/2001 | Cercioglu | H05K 9/0032 174/371 |
| 8,247,707 B2 * | 8/2012 | Li | H05K 9/00 174/377 |

(Continued)

FOREIGN PATENT DOCUMENTS

| TW | 201410132 | 3/2014 |
| WO | 2009006838 | 1/2009 |

OTHER PUBLICATIONS

"Search Report of Europe Counterpart Application", dated Mar. 20, 2018, p. 1-p. 7, in which the listed references were cited.

(Continued)

*Primary Examiner* — Hung V Ngo
(74) *Attorney, Agent, or Firm* — JCIPRNET

(57) ABSTRACT

An assembling component includes a frame and a cover. The frame has an opening, a first plane, and a first assembling structure. The first plane surrounds and is adjacent to the opening. An area of the opening is larger than an area of the first plane. The first assembling structure is formed on the first plane. The cover covers the opening and the first plane and has a second assembling structure. A side of the cover has a second plane parallel to the first plane. The second assembling structure is formed on the second plane. An end of the second assembling structure extends from the second plane toward another side of the cover. The second assembling structure is assembled with the first assembling structure to stop the cover from moving relative to the frame.

19 Claims, 8 Drawing Sheets

(56) References Cited

U.S. PATENT DOCUMENTS

| | | | |
|---|---|---|---|
| 2009/0166081 A1* | 7/2009 | Tsai | H05K 9/0032 |
| | | | 174/350 |
| 2011/0073360 A1 | 3/2011 | Su | |
| 2011/0214916 A1* | 9/2011 | Chang | H05K 9/00 |
| | | | 174/382 |
| 2012/0073873 A1* | 3/2012 | Nash | H05K 9/0047 |
| | | | 174/382 |
| 2012/0281386 A1* | 11/2012 | Kim | H05K 9/0028 |
| | | | 361/818 |
| 2012/0298414 A1* | 11/2012 | Park | H05K 9/0032 |
| | | | 174/382 |
| 2013/0250540 A1* | 9/2013 | Hou | H05K 9/0032 |
| | | | 361/818 |
| 2014/0043785 A1 | 2/2014 | Huang et al. | |
| 2014/0049935 A1 | 2/2014 | Chen et al. | |

OTHER PUBLICATIONS

"Office Action of Taiwan Counterpart Application," dated May 14, 2018, p. 1-p. 7.

* cited by examiner

US 10,257,968 B2

ASSEMBLING COMPONENT AND ASSEMBLING METHOD THEREOF

CROSS-REFERENCE TO RELATED APPLICATION

This application claims the priority benefit of Taiwan application serial no. 106106349, filed on Feb. 24, 2017. The entirety of the above-mentioned patent application is hereby incorporated by reference herein and made a part of this specification.

BACKGROUND OF THE INVENTION

Field of the Invention

The invention relates to a shielding module and an assembly method thereof. More particularly, the invention relates to an assembling component and an assembly method thereof.

Description of Related Art

When an electronic element in an electronic device works, electromagnetic waves are generated most of the time, and signal quality and working performance of other electronic elements are thus affected. For instance, the electromagnetic waves generated by the electronic element may become noise which causes interference to an antenna in the electronic device, and capabilities of sending and receiving signals of the antenna are thereby lowered. This is called electromagnetic interference (EMI).

In recent years, increasing types and numbers of electronic elements are found in electronic devices, and consequently, EMI problem inside the electronic devices appears to have worsened. Before an electronic product forays into the market, the electronic product is required to pass EMI testing conducted by related government agencies of each country, such as the Federal Communications Commission (FCC) of the United States, the China Compulsory Certification (3C) of China, the Conformite Europende (CE) of the European Union, and the Bureau of Standard, Metrology and Inspection (BSMI) of Taiwan. To solve the problem, EMI shielding technology continues to advance.

FIG. 1A illustrates a conventional electromagnetic wave shielding module. In the conventional electromagnetic wave shielding module, a one-piece electromagnetic wave shielding cover body 52 is soldered onto a circuit board 54 and that is difficult to be detached and reworked. FIG. 1B illustrates another conventional electromagnetic wave shielding module. In the conventional electromagnetic shielding module, a clip 62 is soldered onto a circuit board 64, and an electromagnetic wave shielding cover body 66 is held by the clip 62. Thereby, the electromagnetic wave shielding cover body 66 may be detached conveniently; nevertheless, the electromagnetic wave shielding cover body 66 and the circuit board 64 are not securely attached and thus overall structural strength is relatively insufficient. Moreover, with the clip 62 being disposed on the circuit board 64, an overall structural thickness may increase. FIG. 1C illustrates another conventional electromagnetic wave shielding module. In the conventional electromagnetic wave shielding module, a conductive body 72 is coated on an integrated circuit 400 on a circuit board 74 to achieve electromagnetic wave shielding effect. Nevertheless, the electromagnetic wave shielding module is difficult to be detached and reworked since the conductive body 72 is coated on the circuit board 74. As described above, the existing electronic devices are designed to be thin and lightweight, and inevitably, internal allocation space is decreased. Therefore, how the electromagnetic wave shielding structure to be properly allocated in the limited allocation space so as to take up less space and be reworked easily becomes an important issue in electronic device design nowadays.

SUMMARY OF THE INVENTION

The invention provides an assembling component and an assembling method thereof for saving allocation space and manufacturing costs of an electronic device and for the electronic device to be reworked easily.

In an embodiment of the invention, an assembling component includes a frame and a cover. The frame has an opening, a first plane, and a first assembling structure. The first plane surrounds and is adjacent to the opening. An area of the opening is larger than an area of the first plane. The first assembling structure is formed on the first plane. The cover covers the opening and the first plane and has a second assembling structure. A side of the cover has a second plane parallel to the first plane. The second assembling structure is formed on the second plane. An end of the second assembling structure extends from the second plane toward another side of the cover. The second assembling structure is assembled with the first assembling structure to stop the cover from moving relative to the frame.

In an embodiment of the invention, the first assembling structure includes at least one first engagement part and a first positioning part. The at least one engagement part and the first positioning part are both formed on the first plane. The second assembling structure includes at least one second engagement part and a second positioning part. The at least one second engagement part and the second positioning part are both formed on the second plane. The at least one second engagement part is engaged with the at least one first engagement part to stop the cover from moving in a vertical direction relative to the frame. The second positioning part is positioned at the first positioning part to stop the cover from moving in a horizontal direction relative to the frame.

In an embodiment of the invention, the at least one second engagement part is engaged with the at least one first engagement part in the horizontal direction. The second positioning part is positioned at the first positioning part in the vertical direction.

In an embodiment of the invention, the at least one first engagement part includes a notch formed on the first plane. The at least one second engagement part includes a bent section and an engagement section. The bent section is connected between the second plane and the engagement section and is bent relative to the second plane, such that the engagement section is engaged with the at least one first engagement part through the notch.

In an embodiment of the invention, an extending direction of the engagement section is inclined relative to the second plane.

In an embodiment of the invention, the at least one second engagement part further includes an extending section. The extending section is connected to an end of the engagement section and has a guiding inclined surface. The engagement section is adapted to be engaged with the at least one first engagement part through guiding of the guiding inclined surface.

In an embodiment of the invention, the cover has at least one opening slot. The at least one opening slot is formed on the second plane. The at least one second engagement part extends from an inner edge of the at least one opening slot.

In an embodiment of the invention, the first positioning part includes a positioning slot formed on the first plane. The second positioning part includes a bent wall formed on an edge of the cover. The bent wall extends in the vertical direction.

In an embodiment of the invention, the first positioning part includes a guiding inclined surface, and the bent wall is adapted to move toward the positioning slot through guiding of the guiding inclined surface.

In an embodiment of the invention, a number of the at least one first engagement part is plural. A gap between two adjacent ones of the first engagement parts is 2 mm to 7 mm. A number of the at least one second engagement part is plural. A gap between two adjacent ones of the second engagement parts is 2 mm to 7 mm.

In an embodiment of the invention, the cover has at least one extending part, and the at least one extending part is adjacent to the second positioning part and is adapted to be forced to drive the second positioning part to separate from the first positioning part.

In an embodiment of the invention, the frame has at least one extending part, and the at least one extending part extends from the first plane into the opening. An attraction force is adapted to be applied to the at least one extending part to move the frame.

In an embodiment of the invention, the frame has a plurality of side walls, and the side walls are connected to a periphery of the first plane and perpendicular to the first plane.

In an embodiment of the invention, the cover has no side wall.

In an embodiment of the invention, the assembling component includes a circuit board. The frame is disposed on the circuit board, and the frame and the cover mask at least one electronic element on the circuit board.

In an embodiment of the invention, the at least one electronic element is disposed on a third plane on the circuit board, and the first plane and the second plane are parallel to the third plane.

In an embodiment of the invention, a material of the cover and the frame is metal, and the assembling component is an electromagnetic wave shielding module.

In an embodiment of the invention, an assembling method of an assembling component includes following steps. A frame is provided, and the frame has an opening, at least one first engagement part and a first positioning part. A cover is provided, and the cover has at least one second engagement part and a second positioning part. The frame is soldered onto a circuit board. The at least one second engagement part is engaged with the at least one first engagement part in a horizontal direction. The second positioning part is positioned at the first positioning part in a vertical direction perpendicular to the horizontal direction to fix the cover onto the frame.

In an embodiment of the invention, the at least one second engagement part is engaged with the at least one first engagement part in the horizontal direction after the frame is soldered onto the circuit board. The second positioning part is positioned at the first positioning part in the vertical direction to fix the cover onto the frame.

In an embodiment of the invention, the assembling method of the assembling component includes following steps. An attraction force is provided to the frame to move the frame onto the circuit board before the frame is soldered onto the circuit board.

In an embodiment of the invention, the frame is soldered onto the circuit board after the cover is fixed on the frame.

In an embodiment of the invention, the assembling method of the assembling component includes following steps. An attraction force is provided to the cover to move the frame and the cover onto the circuit board before the frame is soldered onto the circuit board.

In an embodiment of the invention, a step of engaging the at least one second engagement part with the at least one first engagement part includes the following. The at least one second engagement part is guided to be engaged with the at least one first engagement part through a guiding inclined surface of the at least one second engagement part.

In an embodiment of the invention, a step of positioning the second positioning part in the first positioning part includes the following. The second positioning part is guided to be position in the first positioning part through a guiding inclined surface of the first positioning part.

In view of the foregoing, in the assembling component provided by the embodiments of the invention, the at least one first engagement part and the first positioning part are both formed on the upper plane of the frame (i.e., the first plane). The at least one second engagement part and the second positioning part are both formed on the upper plane of the cover (i.e., the second plane). In the assembling component, the at least one first engagement part and the first positioning part are respectively matched with the at least one second engagement part and the second positioning part, and that the cover is fixed onto the frame at the upper planes. As such, the frame and the cover are not required to be engaged with each other and be positioned at the lateral surface of the assembling component. Thereby, a structure configured to be combined with the cover is not required to be formed at the side walls by the frame, and the cover is not required to have a side wall configured to be combined with the frame either. Therefore, the height of the side walls of the frame may be reduced and the structure of the cover may be simplified to save allocation space and manufacturing costs of the electronic device. Furthermore, the end of the second assembling structure (i.e., each of the second engagement parts and the second positioning part) extends from the upper plane of the cover (i.e., the second plane) to another side of the cover to prevent the second assembling structure from protruding upward from the upper plane of the cover, and thereby, the size of the assembling structure may be further reduced in the vertical direction. In addition, the frame and the cover are assembled with each other through being engaged with each other as described above and thus may be detached and reworked easily.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 2:
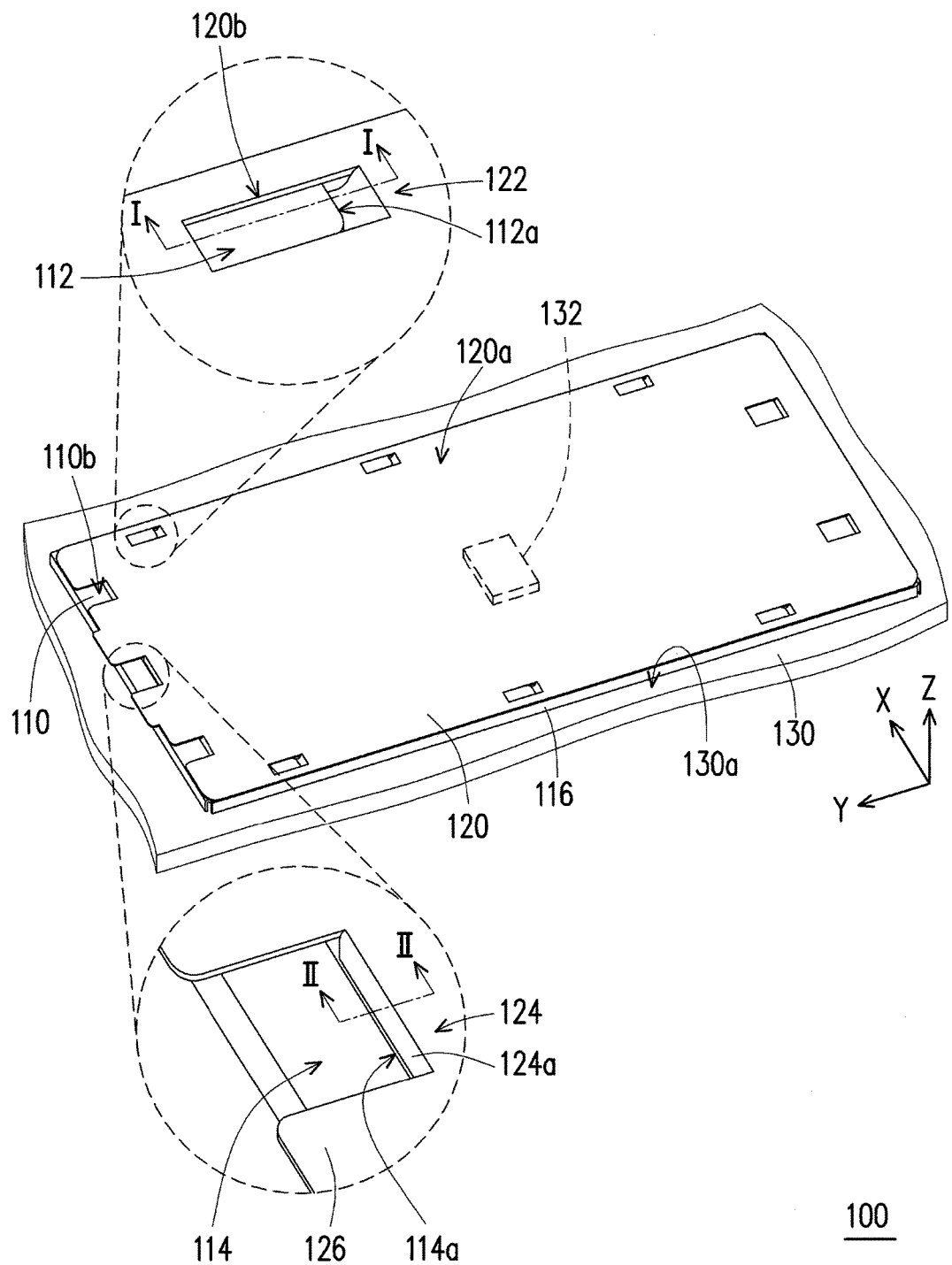
FIG. 2 is a three-dimensional view of an assembling component according to an embodiment of the invention.
Figure 3:
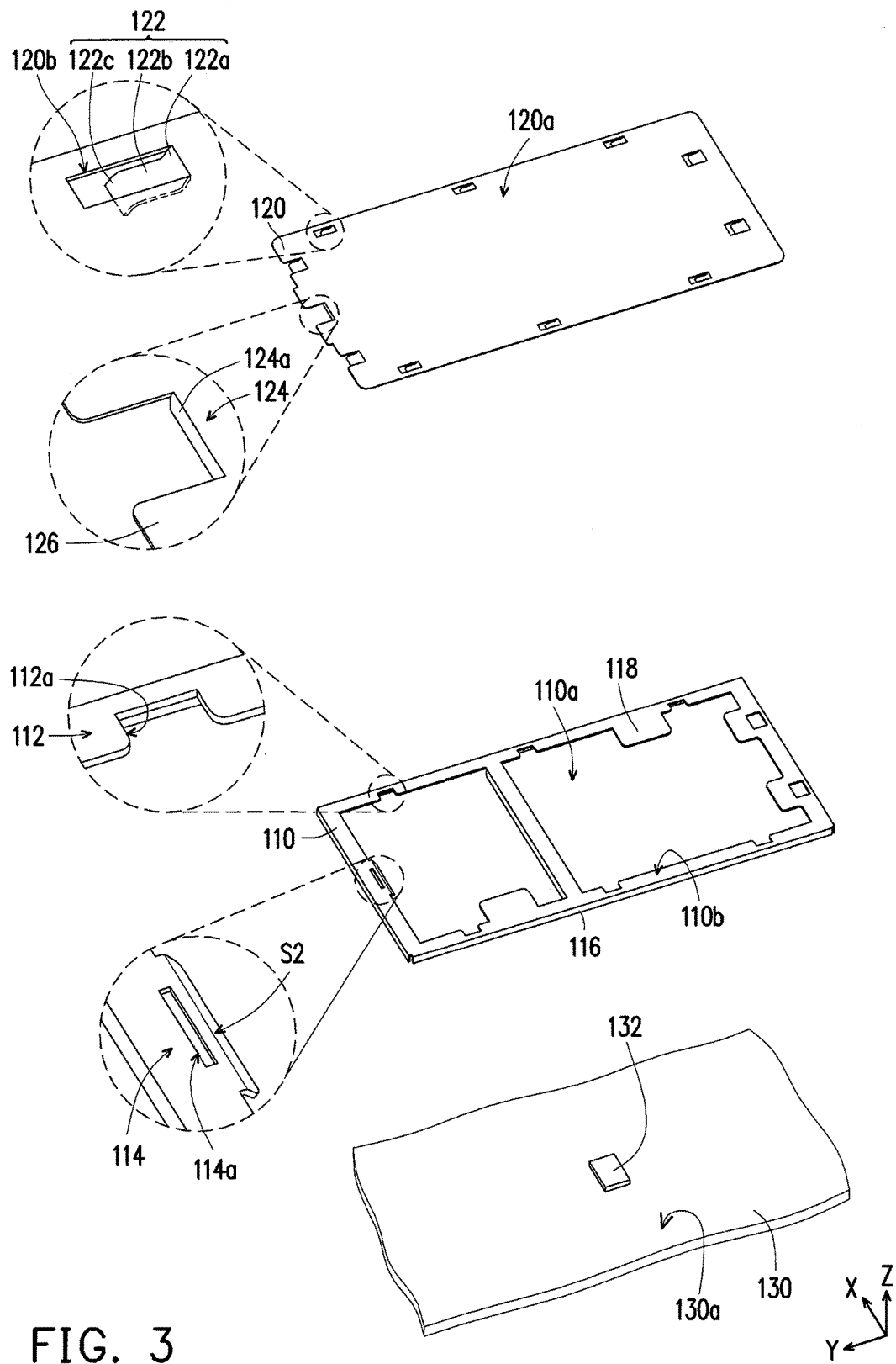
FIG. 3 is an exploded view of the assembling component in FIG. 2.

FIG. 2 is a three-dimensional view of an assembling component according to an embodiment of the invention. FIG. 3 is an exploded view of the assembling component in FIG. 2. Referring to FIG. 2 and FIG. 3, an assembling component 100 provided by the embodiment includes a frame 110 and a cover 120. The frame 110 is assembled with the cover 120. A material of the frame 110 and the cover 120 is, for example, metal, such that the assembling component 100 may act as an electromagnetic wave shielding module. But the invention is not limited thereto. The assembling component 100 further includes a circuit board 130. The frame 110 is soldered onto the circuit board 130 through, for example, the surface mounting technology (SMT) and is electrically connected to a ground plane of the circuit board 130, such that masking and shielding are performed to an electronic element 132 on the circuit board 130 through the frame 110 and the cover 120.

Figure 1A:
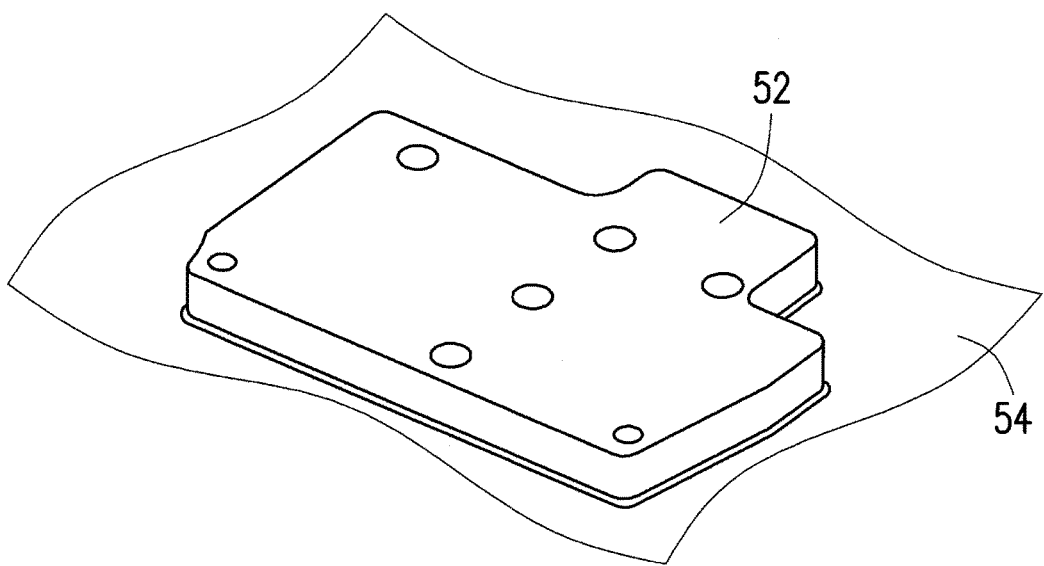
FIG. 1A illustrates a conventional assembling component.
Figure 1B:
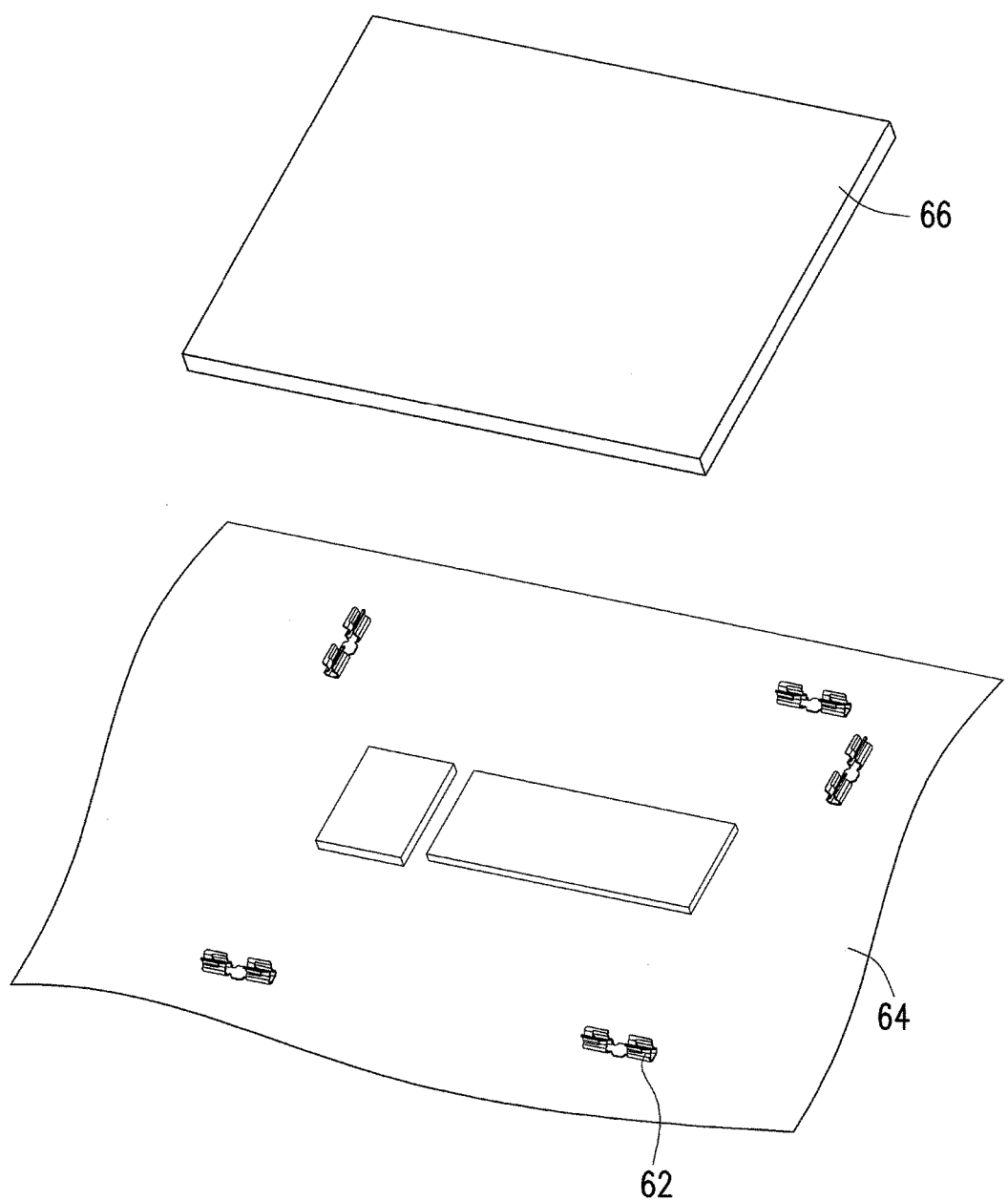
FIG. 1B illustrates another conventional assembling component.
Figure 1C:
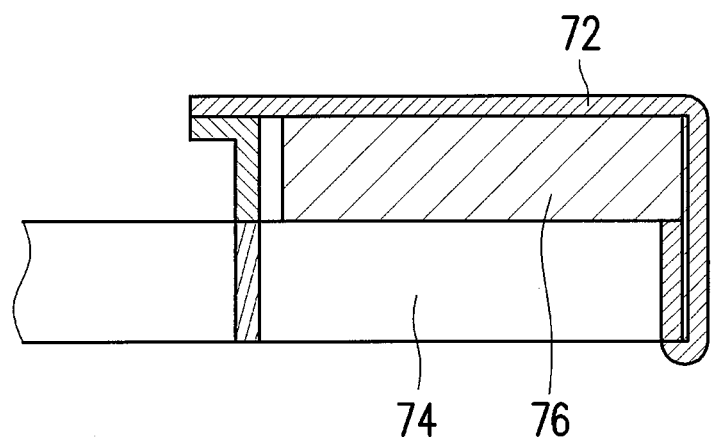
FIG. 1C illustrates another conventional assembling component.

Specifically, the frame 110 has an opening 110a, a first plane 110b, a plurality of side walls 116, and a first assembling structure. The first assembling structure includes a plurality of first engagement parts 112 and a first positioning part 114. The first plane 110b is an outer surface of an upper side of the frame 110 and surrounds and is adjacent to the opening 110a of the frame 110. An area of the opening 110a is larger than an area of the first plane 110b. As such, when the cover 120 is detached from the frame 110, the area of the opening 110a of the frame 110 is large enough to expose the electronic element 132 on the circuit board 130 (shown in FIG. 1), and that the electronic element 132 may be repaired or replaced conveniently. The side walls 116 are connected to a periphery of a first plane 110a and perpendicular to the first plane 110a. A height of each of the side walls 116 is, for example, equal to or slightly greater than a thickness of the electronic element 132, such that sufficient space is provided for the electronic element 132 to be disposed therein. The first assembling structure (i.e., each of the first engagement parts 112 and the first positioning part 114) is formed on the first plane 110b of the frame 110.

The cover 120 covers the opening 110a of the frame 110 and the first plane 110b and has a second assembling structure. The second assembling structure includes a plurality of second engagement parts 122 and a second positioning part 124. A side of the cover 120 has a second plane 120a parallel to the first plane 110a. Each of the second engagement parts 122 and the second positioning part 124 are formed on the second plane 120a of the cover 120. The second plane 120a is an unbent horizontal plane. An end of the second assembling structure (i.e., each of the second engagement parts 122 and the second positioning part 124) extends from the second plane 120a to another side of the cover 120.

The second assembling structure (i.e., each of the second engagement parts 122 and the second positioning parts 124) is assembled with the first assembling structure (i.e., each of the first engagement parts 112 and the first positioning part 114) to stop the cover 120 from moving relative to the frame 110. Specifically, each of the second engagement parts 122 is engaged with each of the first engagement parts 112 in a horizontal direction Y parallel to the first plane 110a to stop the cover 120 from moving relative to the frame 110 in a vertical direction Z perpendicular to the horizontal direction Y. The second positioning part 124 is positioned at the first positioning part 114 in the vertical direction Z to stop the cover 120 from moving relative to the frame 110 in the horizontal direction Y and to stop the cover 120 from moving relative to the frame 110 in a horizontal direction X. In the embodiment, the electronic element 132 is disposed on a third plane 130a on the circuit board 130. The first plane 110a of the frame 110, the second plane 120a of the cover 120, and the third plane 130a of the circuit board 130 are parallel to each other.

According to such arrangement, each of the first engagement parts 112 and the first positioning part 114 are both formed on an upper plane of the frame 110 (i.e., the first plane 110a), and each of the second engagement parts 122 and the second positioning part 124 are both formed on an upper plane of the cover 120 (i.e., the second plane 120a). In the assembling component 100, the first engagement parts 112 and the first positioning part 114 are respectively matched with the second engagement parts 122 and the second positioning part 124, and that the cover 120 is fixed on the frame 110 at the upper planes. As such, the frame 110 and the cover 120 are not required to be engaged with each other and be positioned at a lateral surface of the assembling component 100. Thereby, a structure configured to be combined with the cover 120 is not required to be formed at the side walls 116 by the frame 110, and the cover 120 is not required to have a side wall configured to be combined with the frame 110. Therefore, the height of the side walls 116 of the frame 110 may be lowered and a structure of the cover 120 may be simplified to save allocation space and manufacturing costs of an electronic device. Furthermore, the end of the second assembling structure (i.e., each of the second engagement parts 122 and the second positioning part 124) extends from the upper plane of the cover 120 (i.e., the second plane 120a) toward another side of the cover 120 to prevent the second assembling structure from protruding upward from the upper plane of the cover 120, and thereby a size of the assembling component 100 may be further reduced in the vertical direction. In addition, the frame 110 and the cover 120 are assembled with each other through being engaged with each other as described above and thus may be detached and reworked easily.

In the embodiment, a gap between two adjacent ones of the first engagement parts 112 is, for example, 2 mm to 7 mm. Correspondingly, a gap between two adjacent ones of the second engagement parts 122 is, for example, 2 mm to 7 mm. As such, the cover 120 is securely and tightly engaged with the frame 110, and thereby, electromagnetic wave shielding effect is further enhanced. Nevertheless, the invention is not limited thereto. The gaps between the first engagement parts 112 and the gaps between the second engagement parts 122 may be changed as required in design.

Figure 4:
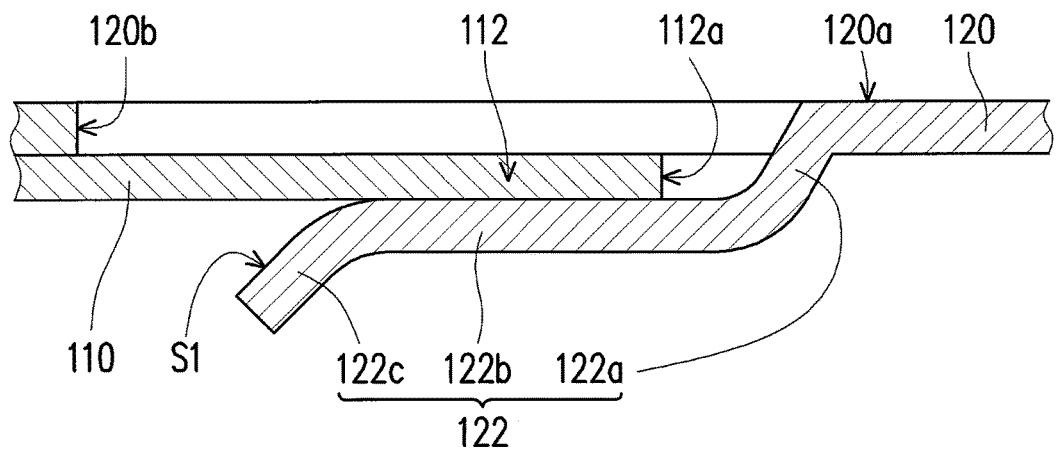
FIG. 4 is a cross-sectional view taken along a line I-I of the assembling component in FIG. 2.

FIG. 4 is a cross-sectional view taken along a line I-I of the assembling component in FIG. 2. Specifically, in the embodiment, the first engagement part 112 includes a notch 112a formed on the first plane 110b as shown in FIG. 2 to FIG. 4. The cover 120 has a plurality of opening slots 120b as shown in FIG. 2 to FIG. 4. Each of the opening slots 120b is formed on the second plane 120a of the cover 120. Each of the second engagement parts 122 extends from an inner edge of the corresponding opening slots 120b. As shown in FIG. 3 and FIG. 4, the second engagement part 122 includes a bent section 122a and an engagement section 122b. The bent section 122a is connected between the second plane 120a of the cover 120 and the engagement section 122b and is bent relative to the second plane 120a, such that the engagement section 122b is engaged with the first engagement part 112 through the notch 112a.

Figure 5:
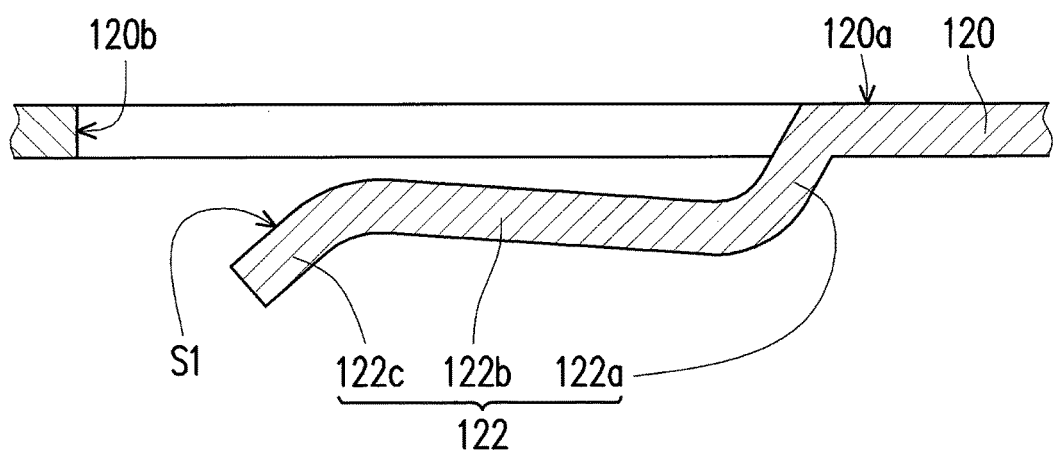
FIG. 5 illustrates the second engagement part separates from the first engagement part in FIG. 4.

FIG. 5 illustrates the second engagement part separates from the first engagement part in FIG. 4. As shown in FIG. 5, when the second engagement part 122 is separated from the first engagement part 112 (as shown in FIG. 4), an extending direction of the engagement section 122b is inclined relative to the second plane 120a. As such, when the second engagement part 122 is engaged with the first engagement part 112 as shown in FIG. 4, the engagement section 122b is forced and elastically deformed downward. Thereby, an upward holding force may be generated by the engagement section 122b in FIG. 4 and applied to the first engagement part 112, such that the cover 120 is securely fixed onto the frame 110. As such, even though the frame 110 and the cover 120 provided by the embodiment are engaged and positioned only at the upper plane of the assembling structure 100 as described above, a favorable fixing effect may still be achieved. In other embodiments, the first engagement part 112 and the second engagement part 122 may be other structures that may be engaged with each other. The invention is not limited thereto.

Figure 6:
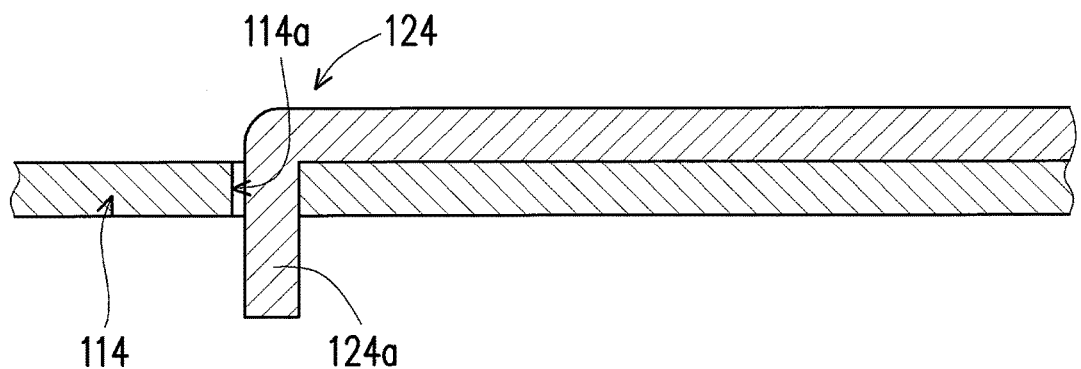
FIG. 6 is a cross-sectional view taken along a line II-II of the assembling component in FIG. 2.

FIG. 6 is a cross-sectional view taken along a line II-II of the assembling component in FIG. 2. The first positioning part 114 provided by the embodiment includes a positioning slot 114a formed on the first plane 110b as shown in FIG. 2 to FIG. 4. The second positioning part 124 includes a bent wall 124a formed on an edge of the cover 120 as shown in FIG. 2 to FIG. 4. The bent wall 124a extends in the vertical direction Z and is adapted to extend into the positioning slot 114a for positioning. In other embodiments, the first positioning part 114 and the second positioning part 124 may be other structures that may be positioned with each other. The invention is not limited thereto.

Besides, in the embodiment, the cover 120 has two extending parts 126 as shown in FIG. 2 and FIG. 3. The two extending parts 126 are respectively adjacent to opposite sides of the second positioning part 124 and adapted to be forced to drive the second positioning part 124 to separate from the first positioning part 114. Specifically, when a user intends to detach the cover 120, the user may flip the two extending parts 126 upward. As such, a portion of the cover 120 is elastically deformed and that the bent wall 124a is separated upward from the positioning slot 114a. Next, the cover 120 is moved in the horizontal direction and thereby, the second engagement parts 122 are not engaged with the corresponding first engagement parts 112.

Figure 7:
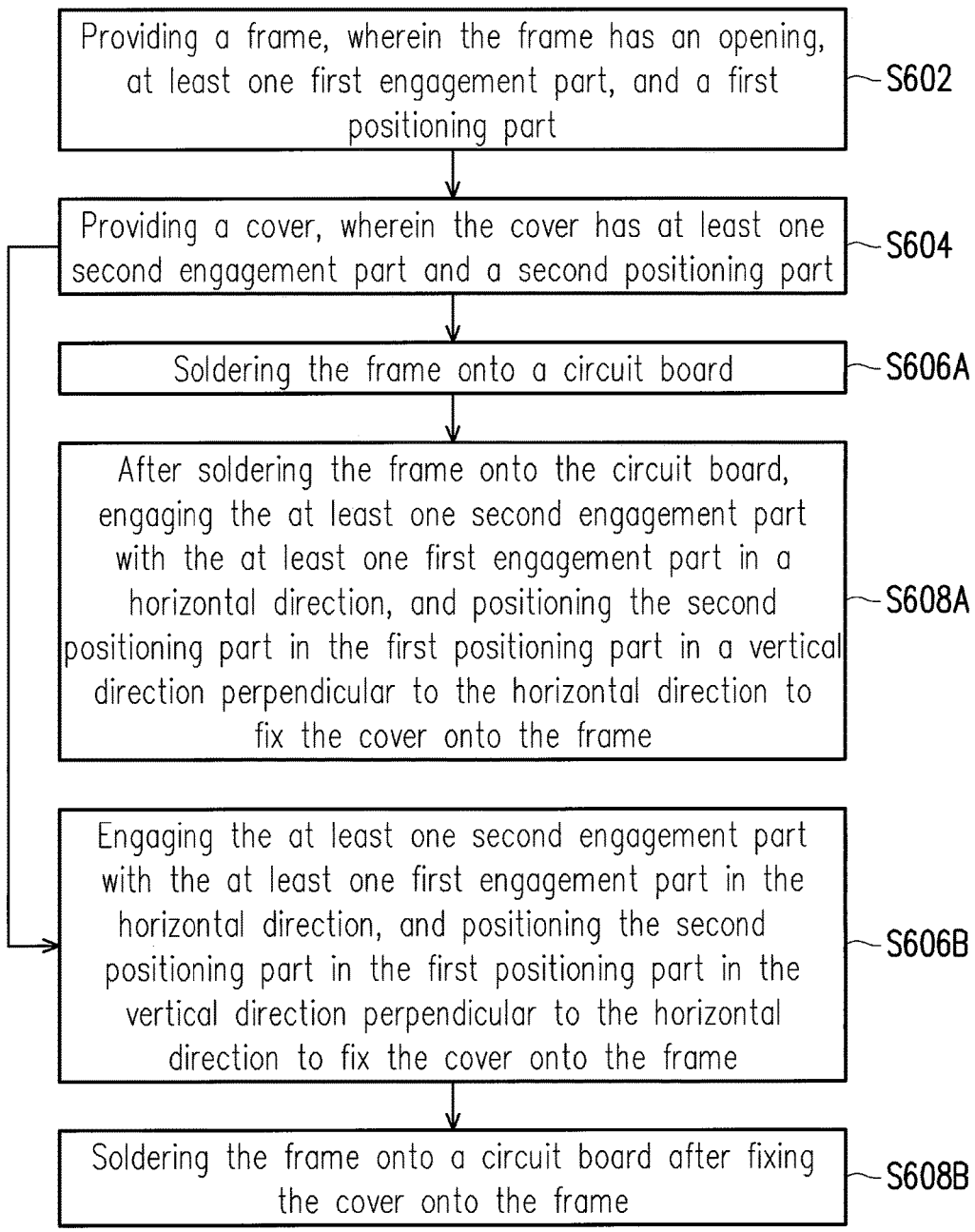
FIG. 7 is a flowchart of an assembling method of an assembling component according to an embodiment of the invention.

An assembling method of the assembling component 100 provided by the embodiment is described as follows. FIG. 7 is a flowchart of an assembling method of an assembling component according to an embodiment of the invention. First, the frame 110 is provided. The frame 110 has the opening 110a, the at least one first engagement part 112 and the first positioning part 114 (step S602). Next, the cover 120 is provided. The cover 120 has the at least one second engagement part 122 and the second positioning part 124 (step S604). The frame 110 is soldered onto the circuit board 130 (step S606A). After the frame 110 is soldered onto the circuit board 130, the at least one second engagement part 122 is engaged with the at least one first engagement part 112 in the horizontal direction Y, and the second positioning part 124 is positioned at the first positioning part 114 in the vertical direction Z perpendicular to the horizontal direction Y to fix the cover 120 onto the frame 110 (step S608A).

In the embodiment, the frame 110 has two extending parts 118 as shown in FIG. 3. Each of the extending parts 118 extends from the first plane 110b into the opening 110a. Before the frame 110 is soldered to the circuit board 130 as described in step S606A, an attraction force provided by an attraction-force-providing device may be applied to each of the extending parts 118 of the frame 110. As such, the frame 110 is moved onto the circuit board 130 for following soldering process to be performed.

In addition, the second engagement part 122 provided by the embodiment includes an extending section 122c as shown in FIG. 3 and FIG. 4. The extending section 122c is connected to an end of the engagement section 122b and has a guiding inclined surface S1. During the process when the second engagement part 122 is engaged with the first engagement part 112 as described in step S608A, the engagement section 122b of the second engagement part 122 may be guided to be engaged with the first engagement part 112 through the inclined surface S1 of the second engagement part 122.

Similarly, the first positioning part 114 provided by the embodiment includes a guiding inclined surface S2 as shown in FIG. 3. During the process when the second positioning part 124 is positioned at the first positioning part 114 as described in step S608A, the bent wall 124a of the second engagement part 124 may be guided to move toward the positioning slot 114a of the first positioning part 114 and positioned at the positioning slot 114a of the first positioning part 114 through the guiding inclined surface S2 of the first positioning part 114.

During the assembling process, the frame 110 is first soldered onto the circuit board 130 and next the cover 120 is assembled with the frame 110. Nevertheless, the invention is not limited thereto. After step S604 is proceeded, the second engagement part 122 may first be engaged with the first engagement part 112 in the horizontal direction Y, and the second positioning part 114 is positioned at the first positioning part 114 in the vertical direction Z perpendicular to the horizontal direction Y, such that the cover 120 is fixed onto the frame 110 (step S606B). Next, after the cover 120 is fixed onto the frame 110, the frame 110 is soldered onto a circuit board 130 (step S608B). In other words, the cover 120 is first assembled with the frame 110 and then the frame 110 is soldered onto the circuit board 130. Through such an assembling method, in the embodiment, the frame 110 and the cover 120 are not engaged nor positioned at the side walls 116 of the frame 110 as described above. Moreover, as the cover 120 has no side wall, and thereby, during the soldering process, the side walls 116 of the frame 110 may not be in contact with a soldering material, which may lead to the cover 120 is soldered and fixed onto the frame 110 unexpectedly.

Before the frame 110 is soldered onto the circuit board 130 as described in step S608B, the attraction force provided by the attraction-force-providing device may first be applied to the cover 120. As such, the cover 120 and the frame 110 are moved onto the circuit board 130 for following soldering process to be performed. Through such the assembling manner, the frame 110 may not need to have the extending parts 118 for the attraction force to be applied on.

To sum up, in the assembling component provided by the embodiments of the invention, the first engagement parts and the first positioning part are both formed on the upper plane of the frame (i.e., the first plane). The second engagement parts and the second positioning part are both formed on the upper plane of the cover (i.e., the second plane). In the assembling component, the first engagement parts and the first positioning part are respectively matched with the second engagement parts and the second positioning part, and that the cover is fixed onto the frame at the upper planes. As such, the frame and the cover are not required to be engaged with each other and be positioned at the lateral surface of the assembling component. Thereby, a structure configured to be combined with the cover is not required to be formed at the side walls by the frame, and the cover is not required to have a side wall configured to be combined with the frame either. Therefore, the height of the side walls of the frame may be reduced and the structure of the cover may be simplified to save allocation space and manufacturing costs of the electronic device. Furthermore, the end of the second assembling structure (i.e., each of the second engagement parts and the second positioning part) extends from the upper plane of the cover (i.e., the second plane) to another side of the cover to prevent the second assembling structure from protruding upward from the upper plane of the cover, and thereby, the size of the assembling structure may be further reduced in the vertical direction. In addition, the frame and the cover are assembled with each other through being engaged with each other as described above and thus may be detached and reworked easily.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. An assembling component, comprising:
a frame, having an opening, a first plane, and a first assembling structure, wherein the first plane surrounds and is adjacent to the opening, an area of the opening is larger than an area of the first plane, the first assembling structure is formed on the first plane; and
a cover, covering the opening and the first plane and having a second assembling structure, wherein a side of the cover has a second plane parallel to the first plane, the second assembling structure is formed on the second plane, an end of the second assembling structure extends toward another side of the cover from the second plane along a direction that is away from the cover,
wherein the second assembling structure is assembled with the first assembling structure to stop the cover from moving relative to the frame, and the second assembling structure is assembled with the first assembling structure by horizontal movement of the cover.

2. The assembling component as claimed in claim 1, wherein the first assembling structure comprises at least one first engagement part and a first positioning part, the at least one first engagement part and the first positioning part are both formed on the first plane, the second assembling structure comprises at least one second engagement part and a second positioning part, the at least one second engagement part and the second positioning part are both formed on the second plane, the second engagement part is engaged with the first engagement part to stop the cover from moving in a vertical direction relative to the frame, and the second positioning part is positioned at the first positioning part to stop the cover from moving in a horizontal direction relative to the frame.

3. The assembling component as claimed in claim 2, wherein the at least one second engagement part is engaged with the at least one first engagement part in the horizontal direction, and the second positioning part is positioned at the first positioning part in the vertical direction.

4. The assembling component as claimed in claim 2, wherein the at least one first engagement part comprises a notch formed on the first plane, the at least one second engagement part comprises a bent section and an engagement section, and the bent section is connected between the second plane and the engagement section and bent relative to the second plane, such that the engagement section is engaged with the at least one first engagement part through the notch.

5. The assembling component as claimed in claim 4, wherein an extending direction of the engagement section is inclined relative to the second plane.

6. The assembling component as claimed in claim 4, wherein the at least one second engagement part further comprises an extending section, the extending section is connected to an end of the engagement section and has a guiding inclined surface, and the engagement section is adapted to be engaged with the at least one first engagement part through guiding of the guiding inclined surface.

7. The assembling component as claimed in claim 2, wherein the cover has at least one opening slot, the at least one opening slot is formed on the second plane, and the at least one second engagement part extends from an inner edge of the at least one opening slot.

8. The assembling component as claimed in claim 2, wherein the first positioning part comprises a positioning slot formed on the first plane, the second positioning part comprises a bent wall formed on an edge of the cover, and the bent wall extends in the vertical direction.

9. The assembling component as claimed in claim 8, wherein the first positioning part comprises a guiding inclined surface, and the bent wall is adapted to move toward the positioning slot through guiding of the guiding inclined surface.

10. The assembling component as claimed in claim 2, wherein a number of the at least one first engagement part is plural, a gap between two adjacent ones of the first engagement parts is 2 mm to 7 mm, a number of the at least one second engagement part is plural, and a gap between two adjacent ones of the second engagement parts is 2 mm to 7 mm.

11. The assembling component as claimed in claim 2, wherein the cover has at least one extending part, and the at least one extending part is adjacent to the second positioning part and is adapted to be forced to drive the second positioning part to separate from the first positioning part.

12. The assembling component as claimed in claim 1, wherein the frame has at least one extending part, the at least one extending part extends from the first plane into the opening, and an attraction force is adapted to be applied to the at least one extending part to move the frame.

13. The assembling component as claimed in claim 1, wherein the frame has a plurality of side walls, and the side walls are connected to a periphery of the first plane and perpendicular to the first plane.

14. The assembling component as claimed in claim 13, wherein the cover has no side wall.

15. The assembling component as claimed in claim 1, comprising a circuit board, wherein the frame is disposed on the circuit board, and the frame and the cover mask at least one electronic element on the circuit board.

16. The assembling component as claimed in claim 15, wherein the at least one electronic element is disposed on a third plane on the circuit board, and the first plane and the second plane are parallel to the third plane.

17. The assembling component as claimed in claim 1, wherein a material of the cover and the frame is metal, and the assembling component is an electromagnetic wave shielding module.

18. An assembling component, comprising:
- a frame, having an opening, a first plane, at least one first engagement part and a first positioning part, wherein the first plane surrounds and is adjacent to the opening, an area of the opening is larger than an area of the first plane, the at least one first engagement part and the first positioning part are formed on the first plane; and
- a cover, covering the opening and the first plane and having at least one second engagement part and a second positioning part, wherein a side of the cover has a second plane parallel to the first plane, the at least one second engagement part and the second positioning part are formed on the second plane, an end of the at least one second engagement part and an end of the second positioning part extend toward another side of the cover from the second plane along a direction that is away from the cover,
- wherein the at least one second engagement part is engaged with the at least one first engagement part and the second positioning part is positioned at the first positioning part to stop the cover from moving relative to the frame, and the at least one second engagement part and the second positioning part are engaged with the at least one first engagement part and positioned at the first positioning part, respectively, by horizontal movement of the cover.

19. An assembling component, comprising:
- a frame, having an opening, a first plane, at least one first engagement part and a first positioning part, wherein the first plane surrounds and is adjacent to the opening, an area of the opening is larger than an area of the first plane, the at least one first engagement part and the first positioning part are formed on the first plane; and
- a cover, covering the opening and the first plane and having at least one second engagement part and a second positioning part, wherein a side of the cover has a second plane parallel to the first plane, the at least one second engagement part and the second positioning part are formed on the second plane, an end of the at least one second engagement part and an end of the second positioning part extend toward another side of the cover from the second plane along a direction that is away from the cover, and the second engagement part and the second positioning part are entirely located at the another side of the cover,
- wherein the at least one second engagement part is engaged with the at least one first engagement part and the second positioning part is positioned at the first positioning part to stop the cover from moving relative to the frame, and the at least one second engagement part and the second positioning part are engaged with the at least one first engagement part and positioned at the first positioning part, respectively, by horizontal movement of the cover.

* * * * *